United States Patent
Han et al.

(10) Patent No.: US 10,396,143 B2
(45) Date of Patent: Aug. 27, 2019

(54) ORGANIC LIGHT EMITTING DISPLAY DEVICE

(71) Applicant: LG Display Co., Ltd., Seoul (KR)

(72) Inventors: Joonsoo Han, Goyang-si (KR); JaeHee Park, Gumi-si (KR); JeongHyeon Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 85 days.

(21) Appl. No.: 15/620,795

(22) Filed: Jun. 12, 2017

(65) Prior Publication Data

US 2017/0288010 A1 Oct. 5, 2017

Related U.S. Application Data

(63) Continuation of application No. 15/139,093, filed on Apr. 26, 2016, now Pat. No. 9,711,588.

(30) Foreign Application Priority Data

Aug. 28, 2015 (KR) .......................... 10-2015-0122111

(51) Int. Cl.
| | |
|---|---|
| H01L 27/32 | (2006.01) |
| H01L 51/52 | (2006.01) |
| H01L 29/417 | (2006.01) |
| H01L 23/00 | (2006.01) |

(52) U.S. Cl.
CPC .......... *H01L 27/3279* (2013.01); *H01L 24/05* (2013.01); *H01L 27/3276* (2013.01); *H01L 29/41733* (2013.01); *H01L 51/5209* (2013.01); *H01L 51/5228* (2013.01); *H01L 51/5234* (2013.01); *H01L 27/3246* (2013.01); *H01L 27/3248* (2013.01); *H01L 51/5218* (2013.01); *H01L 2224/0508* (2013.01); *H01L 2224/0558* (2013.01); *H01L 2227/323* (2013.01); *H01L 2251/5315* (2013.01)

(58) Field of Classification Search
CPC . H01L 27/3279; H01L 24/05; H01L 27/3276; H01L 29/41733; H01L 51/5209; H01L 51/5228; H01L 51/5234; H01L 27/3246
USPC .......................................................... 257/40
See application file for complete search history.

(56) References Cited

U.S. PATENT DOCUMENTS

| | | |
|---|---|---|
| 5,067,042 A | 11/1991 | Nagano |
| 2004/0085488 A1 | 5/2004 | Cho et al. |
| 2004/0263710 A1 | 12/2004 | Song et al. |
| 2006/0158095 A1* | 7/2006 | Imamura ............. H01L 27/3279 313/500 |
| 2006/0244741 A1 | 11/2006 | Kimura et al. |

(Continued)

*Primary Examiner* — Dzung Tran
(74) *Attorney, Agent, or Firm* — Fenwick & West LLP

(57) ABSTRACT

Disclosed is an organic light emitting display device that may include first and second pads on a pad area of a substrate, wherein the first pad includes a first bonding region and a first link region, and the second pad includes a second bonding region, a contact region, and a second link region. A first bonding electrode in the first bonding region is electrically connected to one or more signal lines in the active area of the device through contact holes in the first bonding region. A second bonding electrode is electrically connected to one or more signal lines of the device through contact holes in the contact region. The contact region is closer to the active area than the first bonding region.

20 Claims, 6 Drawing Sheets

(56) References Cited

U.S. PATENT DOCUMENTS

| | | | |
|---|---|---|---|
| 2008/0191603 A1* | 8/2008 | Kubota | H01L 51/5228 313/498 |
| 2010/0079419 A1 | 4/2010 | Shibusawa | |
| 2010/0163284 A1* | 7/2010 | Tanahara | G02F 1/133351 174/255 |
| 2014/0022230 A1* | 1/2014 | Hasumi | G09G 3/3696 345/212 |
| 2015/0183180 A1* | 7/2015 | Park | B32B 9/04 428/139 |

* cited by examiner

ORGANIC LIGHT EMITTING DISPLAY DEVICE

CROSS REFERENCE TO RELATED APPLICATIONS

This application is a continuation of U.S. application Ser. No. 15/139,093 filed on Apr. 26, 2016, which claims the benefit of Republic of Korea Patent Application No. 10-2015-0122111 filed on Aug. 28, 2015, each of which is hereby incorporated by reference as if fully set forth herein.

BACKGROUND

Field of the Disclosure

Embodiments of the present invention relate to an organic light emitting display device, and more particularly, to a top emission type organic light emitting display device.

Discussion of the Related Art

An organic light emitting display (OLED) device, which is a self light emitting display device, has advantages of low power consumption, rapid response speed, high emission efficiency, high luminance, and wide viewing angle.

According to a direction of light emitted from an organic light emitting device, the OLED device may be largely classified into a top emission type and a bottom emission type. In case of the bottom emission type, a circuit device is disposed between an emitting layer and an image displaying surface, whereby an aperture ratio may be lowered due to the circuit device. Meanwhile, in case of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on an active area of a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to reduce a resistance of a cathode electrode 80 to be explained later.

On the anode electrode 40 and the auxiliary electrode 50, a bank 60 is provided to define a pixel region. Also, an organic emitting layer 70 is provided in the pixel region defined by the bank 60, and the cathode electrode 80 is provided on the organic emitting layer 70.

In case of the top emission type, light emitted from the organic emitting layer 70 passes through the cathode electrode 80. In this reason, the cathode electrode 80 is formed of a transparent conductive material, which causes the increase of resistance therein. In order to reduce the resistance of the cathode electrode 80, the cathode electrode 80 is connected with the auxiliary electrode 50.

The gate insulating film 12 is provided on a pad area of the substrate 10, a first signal pad 90 is provided on the gate insulating film 12, and the insulating interlayer 14 is provided on the first signal pad 90.

A second signal pad 95 is provided on the insulating interlayer 14. The second signal pad 95 is connected with the first signal pad 90 via a contact hole provided in the insulating interlayer 14.

The passivation layer 20 is provided on the second signal pad 95, and a hole is provided in the passivation layer 20. Through the hole provided in the passivation layer 20, the second signal pad 95 is exposed externally. In order to connect the second signal pad 95 with an external driving circuit, the hole is provided in the passivation layer 20, and the second signal pad 95 is exposed externally.

In order to overcome a problem relating to a corrosion of the second signal pad 95 in the related art top emission type organic light emitting display device of FIG. 1, pad electrodes for covering the second signal pad 95 are provided. However, if applying the pad electrodes, a bonding process of the pad area may be difficult.

SUMMARY

Accordingly, embodiments of the present invention are directed to a top emission type organic light emitting display device that substantially obviates one or more problems due to limitations and disadvantages of the related art.

An aspect of embodiments of the present invention is directed to provide a top emission type organic light emitting display device which facilitates a bonding process in a pad area.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device that may include first and second pads on a pad area of a substrate, wherein the first pad includes a first bonding region and a first link region, and the second pad includes a second bonding region, a contact region and a second link region.

Embodiments relate to a display device including a substrate with an active area and a pad area, a first signal line and a second signal line in the active area, and a first pad in the pad area electrically connected to the first signal line. The first pad includes a link region electrically connected to the first signal line, and a first bonding region having a first bonding electrode for bonding to an external circuit. The first bonding region includes one or more first contact holes through which the first bonding electrode is electrically connected to the link region. The display device also includes a second pad in the pad area electrically connected to the second signal line. The second pad includes a second bonding region having a second bonding electrode for bonding to the external circuit, and a contact region electrically connected to the second bonding region. The contact region has one or more second contact holes through which the second bonding electrode is electrically connected to the second signal line. The contact region of the second pad is closer to the active area than the first bonding region of the first pad.

In one embodiment, a width of the first bonding region of the first pad is greater than a width of the contact region of the second pad.

In one embodiment, a number of the first contact holes in the first bonding region is greater than a number of the second contact holes in the contact region of the second pad.

In one embodiment, a width of the second bonding region in the second pad is smaller than a width of the contact region in the second pad.

In one embodiment, a width of the second bonding region in the second pad is greater than a width of the link region in the first pad.

In one embodiment, the cross-sectional structure of the first bonding region is substantially identical to a cross-sectional structure of the contact region.

In one embodiment, the second bonding electrode is on an insulating layer having the one or more second contact holes, and the second bonding electrode is electrically connected to the second signal line through the one or more second contact holes in the insulating layer.

In one embodiment, a short preventing layer covers the contact region of the second pad.

In one embodiment, the second pad further includes a bridge region electrically connecting the second bonding region and the contact region.

In one embodiment, a width of the bridge region is smaller than a width of the second bonding region.

In one embodiment, a width of the bridge region is smaller than a width of the contact region.

In one embodiment, at least one of the first signal line or the second signal line is at least one of a data line, a gate line, a reference line, or a power source line.

In one embodiment, the display device further includes a thin film transistor having an active layer, a gate electrode, a source electrode, and a drain electrode. At least a portion of the contact region of the second pad is in a same layer as at least one of the gate electrode, the source electrode, or the drain electrode, or at least a portion of the first bonding region of the first pad is in a same layer as at least one of the gate electrode, the source electrode, or the drain electrode.

In one embodiment, the display device further includes an anode electrode, an organic emitting layer, and a cathode electrode. At least a portion of the contact region of the second pad is in a same layer as the anode electrode, or at least a portion of the first bonding region of the first pad is in a same layer as the anode electrode.

In one embodiment, the display device further includes a pixel. The pixel includes a thin film transistor having an active layer, a gate electrode, a source electrode, and a drain electrode. It also includes a first anode electrode electrically connected to the drain electrode, a second anode electrode electrically connected to the first anode electrode, a cathode electrode, an organic emitting layer between the second anode electrode and the cathode electrode, a first auxiliary electrode, and a second auxiliary electrode electrically connected to the first auxiliary electrode and the cathode electrode.

In one embodiment, at least one of the contact region of the second pad or the first bonding region of the first pad includes a first signal pad in a same layer as the gate electrode, and a second signal pad in a same layer as the source electrode and the drain electrode. The second signal pad is in the one or more second contact holes. A first pad electrode is disposed in a same layer as the first anode electrode and the first auxiliary electrode, and a second pad electrode is disposed in a same layer as the second anode electrode and the second auxiliary electrode.

In one embodiment, the display device further includes a pixel. The pixel includes a thin film transistor having an active layer, a gate electrode, a source electrode, and a drain electrode. An anode electrode is electrically connected to the drain electrode, an organic emitting layer is connected to the anode electrode, and a cathode electrode is connected to the organic emitting layer. At least one of the contact region of the second pad or the first bonding region of the first pad includes a first signal pad in a same layer as the gate electrode, a second signal pad in a same layer as the source electrode and the drain electrode. The second signal pad is in the one or more second contact holes. A first pad electrode is in a same layer as the anode electrode.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings.

DETAILED DESCRIPTION OF THE INVENTION

Figure 1:
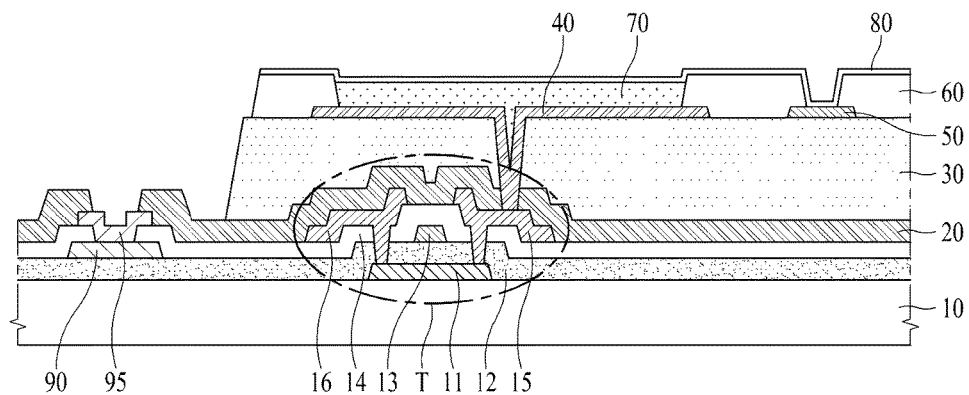
FIG. 1 is a cross sectional view of a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present invention will be described in detail with reference to the accompanying drawings.

Figure 2:
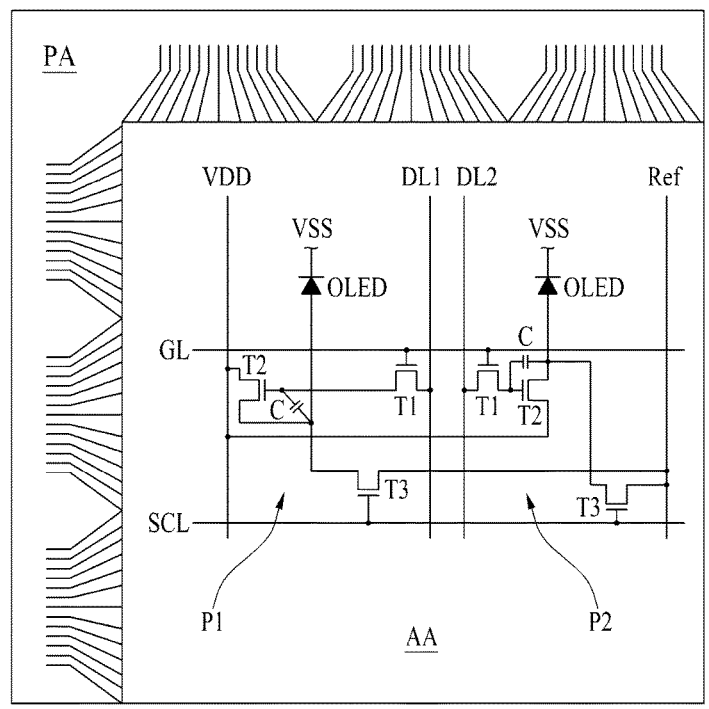
FIG. 2 is a schematic view of an organic light emitting display device, according to one embodiment of the present invention.

FIG. 2 is a schematic view of an organic light emitting display device, according to one embodiment of the present invention.

As shown in FIG. 2, the organic light emitting display device according to one embodiment of the present invention may include an active area (AA) and a pad area (PA). The pad area (PA) is provided in an outer periphery of the active area (AA).

In the active area (AA), a gate line (GL) and a sensing control line (SCL) are disposed in a first direction, for example, a length direction, and are provided at fixed intervals. Also, in the active area (AA), a power source line (VDD), a first data line (DL1), a second data line (DL2), and a reference line (Ref) are disposed in a second direction, for example, a width direction, and are provided at fixed intervals.

A first pixel (P1) is defined by a combination of the gate line (GL) and the sensing control line (SCL) disposed in the length direction, and the power source line (VDD) and the first data line (DL1) disposed in the width direction. Also, a second pixel (P2) is defined by a combination of the gate line (GL) and the sensing control line (SCL) disposed in the length direction, and the second data line (DL2) and the reference line (Ref) disposed in the width direction. In this structure, the power source line (VDD) and the reference line (Ref) are shared by the first pixel (P1) and the second pixel (P2) being adjacent to each other so that it is possible to reduce a total number of lines.

Each of the first pixel (P1) and the second pixel (P2) is provided with a switching thin film transistor (T1), a driving thin film transistor (T2), a sensing thin film transistor (T3), a capacitor (C), and an organic light emitting diode (OLED).

The switching thin film transistor (T1) is switched by a gate signal supplied to the gate line (GL), and the switching thin film transistor (T1) supplies a data voltage, which is supplied from the first and second data lines (DL1, DL2), to the driving thin film transistor (T2).

The driving thin film transistor (T2) is switched by the data voltage supplied from the switching thin film transistor (T1), and the driving thin film transistor (T2) generates a data current through the use of power supplied from the power source line (VDD), and supplies the generated data current to the organic light emitting diode (OLED).

The sensing thin film transistor (T3) is provided to sense a threshold voltage deviation of the driving thin film transistor (T2), wherein the threshold voltage deviation may cause a degradation of picture quality. The threshold voltage deviation is sensed in a sensing mode. In response to a sensing control signal supplied from the sensing control line (SCL), the sensing thin film transistor (T3) supplies a voltage of the driving thin film transistor (T2) to the reference line (Ref).

The capacitor (C) maintains the data voltage supplied to the driving thin film transistor (T2) for a frame, and the capacitor (C) is connected with each of gate and source electrodes of the driving thin film transistor (T2).

The organic light emitting diode (OLED) emits a light in accordance with the data current supplied from the driving thin film transistor (T2). The organic light emitting diode (OLED) may include a first electrode, an emission layer and a second electrode. The first electrode is connected with the source electrode of the driving thin film transistor (T2), and the second electrode is connected with a low power source line (VSS). At this time, the first electrode functions as an anode, and the second electrode functions as a cathode.

Figure 3:
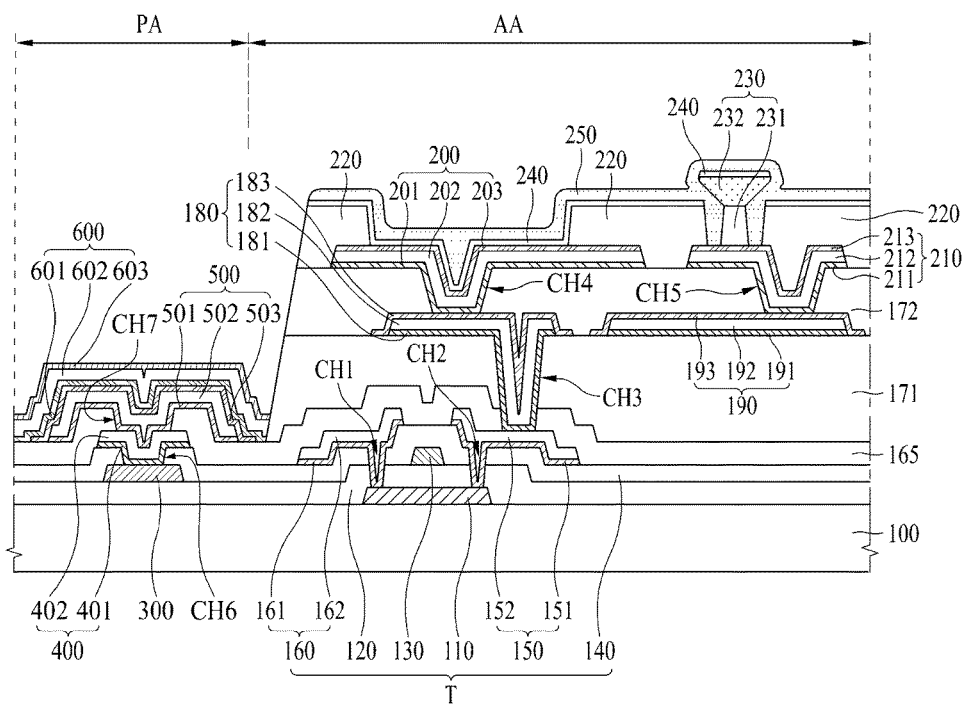
FIG. 3 is a cross sectional view of the organic light emitting display device, according to one embodiment of the present invention.

FIG. 3 is a cross sectional view of the organic light emitting display device, according to one embodiment of the present invention.

As shown in FIG. 3, the organic light emitting display device according to one embodiment of the present invention may include an active area (AA) and a pad area (PA) on a substrate 100.

In the active area (AA) of the substrate 100, there are a thin film transistor layer (T), a passivation layer 165, a first planarization layer 171, a second planarization layer 172, a first anode electrode 180, a second anode electrode 200, a first auxiliary electrode 190, a second auxiliary electrode 210, a bank 220, a partition 230, an organic emitting layer 240, and a cathode electrode 250.

A thin film transistor provided in the thin film transistor layer (T) corresponds to the aforementioned driving thin film transistor (T2) shown in FIG. 2. The thin film transistor layer (T) may include an active layer 110, a gate insulating film 120, a gate electrode 130, an insulating interlayer 140, a source electrode 150, and a drain electrode 160.

The active layer 110 is provided on the substrate 100, and the active layer 110 overlaps with the gate electrode 130. The active layer 110 may be formed a silicon-based semiconductor material or an oxide-based semiconductor material. Although not shown, a light shielding layer may be additionally provided between the substrate 100 and the active layer 110. In this case, an external light, which is incident on a lower surface of the substrate 100, is blocked by the light shielding layer so that it is possible to prevent the active layer 100 from being damaged by the external light.

The gate insulating film 120 is provided on the active layer 110. The gate insulating film 120 insulates the active layer 110 and the gate electrode 130 from each other. For example, the gate insulating film 120 may be formed of an inorganic insulating material, and more particularly, the gate insulating film 120 may be formed in a single-layered structure of the inorganic insulating material such as silicon oxide (SiOx) or silicon nitride (SiNx), or a multi-layered structure of the above silicon oxide (SiOx) and silicon nitride (SiNx), but is not limited to these structures. The gate insulating film 120 may extend to the pad area (PA).

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 may be formed in a single-layered structure or multi-layered structure among molybdenum (Mo), aluminum (Al), chrome (Cr), aurum (Au), titanium (Ti), nickel (Ni), neodymium (Nd), copper (Cu) and their alloys, but is not limited to these materials.

The insulating interlayer 140 is provided on the gate electrode 130. The insulating interlayer 140 is formed of the same material as that of the gate insulating film 120. For example, the insulating interlayer 140 may be formed in a single-layered structure of the inorganic insulating material such as silicon oxide (SiOx) or silicon nitride (SiNx), or a multi-layered structure of the above silicon oxide (SiOx), silicon nitride (SiNx) and their alloys, but is not limited to these materials. The insulating interlayer 140 may extend to the pad area (PA).

The source electrode 150 and the drain electrode 160 confronting each other are provided on the insulating interlayer 140. A first contact hole (CH1) for exposing one end of the active layer 110 is provided in the aforementioned gate insulating film 120 and the insulating interlayer 140, and a second contact hole (CH2) for exposing the other end of the active layer 110 is provided in the aforementioned gate insulating film 120 and the insulating interlayer 140. The source electrode 150 is connected with the other end of the active layer 110 via the second contact hole (CH2), and the drain electrode 160 is connected with one end of the active layer 110 via the first contact hole (CH1).

The source electrode 150 may include a lower source electrode 151 and an upper source electrode 152.

The lower source electrode 151 is provided between the insulating interlayer 140 and the upper source electrode 152, wherein the lower source electrode 151 enhances an adhesive strength between the insulating interlayer 140 and the upper source electrode 152. Also, the lower source electrode 151 protects a lower surface of the upper source electrode 152 so that it is possible to prevent the lower surface of the upper source electrode 152 from being corroded. Thus, an oxidation degree of the lower source electrode 151 may be lower than an oxidation degree of the upper source electrode 152. That is, a corrosion resistance in a material of the lower source electrode 151 may be superior to a corrosion resistance in a material of the upper source electrode 152. The lower source electrode 151 functions as an adhesion enhancement layer or a corrosion preventing layer. The lower source electrode 151 may be formed of an alloy MoTi of molybdenum (Mo) and titanium (Ti), but is not limited to this material.

The upper source electrode 152 is provided on an upper surface of the lower source electrode 151. The upper source electrode 152 may be formed of a low-resistance metal material such as copper (Cu), but not limited to this metal material. The upper source electrode 152 may be formed of a metal material whose resistance is relatively lower than that of the lower source electrode 151. In order to lower a total resistance of the source electrode 150, a thickness of the upper source electrode 152 is larger than a thickness of the lower source electrode 151, preferably.

In the same way as the aforementioned source electrode 150, the drain electrode 160 may include a lower drain electrode 161 and an upper drain electrode 162.

The lower drain electrode 161 is provided between the insulating interlayer 140 and the upper drain electrode 162, wherein the lower drain electrode 161 enhances an adhesive strength between the insulating interlayer 140 and the upper drain electrode 162. Also, the lower drain electrode 161 prevents a lower surface of the upper drain electrode 162 from being corroded. Thus, an oxidation degree of the lower drain electrode 161 may be lower than an oxidation degree of the upper drain electrode 162. That is, a corrosion resistance in a material of the lower drain electrode 161 may be superior to a corrosion resistance in a material of the upper drain electrode 162. The lower drain electrode 161 may be formed of an alloy MoTi of molybdenum (Mo) and titanium (Ti), but is not limited to this material.

The upper drain electrode 162 is provided on an upper surface of the lower drain electrode 161. The upper drain electrode 162 may be formed of the same material as that of the aforementioned upper source electrode 152, for example, copper (Cu), but not limited to this material. In order to lower a total resistance of the drain electrode 160, a thickness of the upper drain electrode 162 is larger than a thickness of the lower drain electrode 161, preferably.

The upper drain electrode 162 may be formed of the same material as that of the upper source electrode 152, and the upper drain electrode 162 may be formed in the same thickness as that of the upper source electrode 152. The lower drain electrode 161 may be formed of the same material as that of the lower source electrode 151, and the lower drain electrode 161 may be formed in the same thickness as that of the lower source electrode 151. In this case, the drain electrode 160 and the source electrode 150 may be simultaneously manufactured in the same process.

A structure of the thin film transistor layer (T) is not limited to the above structure, that is, a structure of the thin film transistor layer (T) may be changed to various shapes generally known to those in the art. For example, the drawing shows a top gate structure where the gate electrode 130 is provided on the active layer 110, but not necessarily. That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 may be formed of an inorganic insulating material, for example, silicon oxide (SiOx)

film or silicon nitride (SiNx) film, but is not limited to these materials. The passivation layer 165 may extend to the pad area (PA).

The first planarization layer 171 is provided on the passivation layer 165. The first planarization layer 171 is provided to planarize an upper surface of the substrate 100 with the thin film transistor (T). The first planarization layer 171 may be formed of an organic insulating material, for example, acryl resin, epoxy resin, phenolic resin, polyamide resin, polyimide resin, and etc., but is not limited to these materials. The first planarization layer 171 may extend to the pad area (PA).

The first anode electrode 180 and the first auxiliary electrode 190 are provided on the first planarization layer 171. That is, the first anode electrode 180 and the first auxiliary electrode 190 are disposed in the same layer. A third contact hole (CH3) for exposing the source electrode 150 is provided in the aforementioned passivation layer 165 and the first planarization layer 171. The source electrode 150 and the first anode electrode 180 are connected with each other via the third contact hole (CH3).

The first anode electrode 180 may include a first lower anode electrode 181, a first upper anode electrode 182 and a first cover anode electrode 183.

The first lower anode electrode 181 is provided between the planarization layer 170 and the first upper anode electrode 182, wherein the first lower anode electrode 181 enhances an adhesive strength between the planarization layer 170 and the first upper anode electrode 182. Also, the first lower anode electrode 181 protects a lower surface of the first upper anode electrode 182 so that it is possible to prevent the lower surface of the first upper anode electrode 182 from being corroded. Thus, an oxidation degree of the first lower anode electrode 181 may be lower than an oxidation degree of the first upper anode electrode 182. That is, a corrosion resistance in a material of the first lower anode electrode 181 may be superior to a corrosion resistance in a material of the first upper anode electrode 182. Also, the first lower anode electrode 181 protects an upper surface of the upper source electrode 152 so that it is possible to prevent the upper surface of the upper source electrode 152 from being corroded. Thus, an oxidation degree of the first lower anode electrode 181 may be lower than an oxidation degree of the upper source electrode 152. That is, a corrosion resistance in a material of the first lower anode electrode 181 may be superior to a corrosion resistance in a material of the upper source electrode 152. The first lower anode electrode 181 prevents the upper surface of the upper source electrode 152 from being corroded so that it is possible to provide the aforementioned dual-layered structure in the source electrode 150. The first lower anode electrode 181 functions as an adhesion enhancement layer or a corrosion preventing layer. The first lower anode electrode 181 may be formed of an alloy MoTi of molybdenum (Mo) and titanium (Ti), but is not limited to this material.

The first upper anode electrode 182 is provided between the first lower anode electrode 181 and the first cover anode electrode 183. The first upper anode electrode 182 may be formed of a low-resistance metal material such as copper (Cu), but is not limited to this metal material. The first upper anode electrode 182 may be formed of a metal material whose resistance is relatively lower than that in each of the first lower anode electrode 181 and the first cover anode electrode 183. In order to lower a total resistance of the first anode electrode 180, a thickness of the first upper anode electrode 182 is larger than a thickness in each of the first lower anode electrode 181 and the first cover anode electrode 183, preferably.

The first cover anode electrode 183 is provided on the first upper anode electrode 182. The first cover anode electrode 183 covers upper and lateral surfaces of the first upper anode electrode 182 so that the first cover anode electrode 183 prevents the first upper anode electrode 182 from being corroded. Thus, an oxidation degree of the first cover anode electrode 183 may be lower than an oxidation degree of the first upper anode electrode 182. That is, a corrosion resistance in a material of the first cover anode electrode 183 may be superior to a corrosion resistance in a material of the first upper anode electrode 182.

The first cover anode electrode 183 also covers lateral surfaces of the first lower anode electrode 181. In this case, an oxidation degree of the first cover anode electrode 183 may be lower than an oxidation degree of the first lower anode electrode 181. That is, a corrosion resistance in a material of the first cover anode electrode 183 may be superior to a corrosion resistance in a material of the first lower anode electrode 181. The first cover anode electrode 183 may be formed of a transparent conductive material such as indium-tin-oxide (ITO), but is not limited to this material.

In the same way as the aforementioned first anode electrode 180, the first auxiliary electrode 190 may include a first lower auxiliary electrode 191, a first upper auxiliary electrode 192, and a first cover auxiliary electrode 193.

The first lower auxiliary electrode 191 is provided between the first planarization layer 171 and the first upper auxiliary electrode 192, wherein the first lower auxiliary electrode 191 enhances an adhesive strength between the first planarization layer 171 and the first upper auxiliary electrode 192, and also prevents a lower surface of the first upper auxiliary electrode 192 from being corroded. Thus, an oxidation degree of the first lower auxiliary electrode 191 may be lower than an oxidation degree of the first upper auxiliary electrode 192. That is, a corrosion resistance in a material of the first lower auxiliary electrode 191 may be superior to a corrosion resistance in a material of the first upper auxiliary electrode 192. The first lower auxiliary electrode 191 may be formed of the same material as that of the aforementioned first lower anode electrode 181, that is, an alloy MoTi of molybdenum (Mo) and titanium (Ti), but is not limited to this material.

The first upper auxiliary electrode 192 is provided between the first lower auxiliary electrode 191 and the first cover auxiliary electrode 193. The first upper auxiliary electrode 192 may be formed of the same material as that of the aforementioned first upper anode electrode 182, that is, copper (Cu), but is not limited to this material. In order to lower a total resistance of the first auxiliary electrode 190, a thickness of the first upper auxiliary electrode 192 with a relatively low resistance is larger than a thickness of each of the first lower auxiliary electrode 191 and the first cover auxiliary electrode 193 with a relatively high resistance, preferably.

The first cover auxiliary electrode 193 is provided on the first upper auxiliary electrode 192. The first cover auxiliary electrode 193 covers upper and lateral surfaces of the first upper auxiliary electrode 192 so that the first cover auxiliary electrode 193 prevents the first upper auxiliary electrode 192 from being corroded. Thus, an oxidation degree of the first cover auxiliary electrode 193 may be lower than an oxidation degree of the first upper auxiliary electrode 192. That is, a corrosion resistance in a material of the first cover auxiliary electrode 193 may be superior to a corrosion resistance in a material of the first upper auxiliary electrode 192.

The first cover auxiliary electrode 193 also covers lateral surfaces of the first lower auxiliary electrode 191. In this case, an oxidation degree of the first cover auxiliary electrode 193 may be lower than an oxidation degree of the first lower auxiliary electrode 191. That is, a corrosion resistance in a material of the first cover auxiliary electrode 193 may be superior to a corrosion resistance in a material of the first lower auxiliary electrode 191. The first cover auxiliary electrode 193 may be formed of a transparent conductive material such as indium-tin-oxide (ITO), but is not limited to this material.

The first cover auxiliary electrode 193 may be formed of the same material as that of the first cover anode electrode 183, and the first cover auxiliary electrode 193 may be formed in the same thickness as that of the first cover anode electrode 183. The first upper auxiliary electrode 192 may be formed of the same material as that of the first upper anode electrode 182, and the first upper auxiliary electrode 192 may be formed in the same thickness as that of the first upper anode electrode 182. The first lower auxiliary electrode 191 may be formed of the same material as that of the first lower anode electrode 181, and the first lower auxiliary electrode 191 may be formed in the same thickness as that of the first lower anode electrode 181. In this case, the first auxiliary electrode 190 and the first anode electrode 180 may be simultaneously manufactured in the same process.

The second planarization layer 172 is provided on the first auxiliary electrode 190 and the first anode electrode 180. The second planarization layer 172 together with the aforementioned first planarization layer 171 planarizes the upper surface of the substrate 100. The second planarization layer 172 may be formed of an organic insulating material, for example, acryl resin, epoxy resin, phenolic resin, polyamide resin, polyimide resin, and etc., but not limited to these materials. The second planarization layer 172 may not extend to the pad area (PA).

Fourth and fifth contact holes (CH4, CH5) are provided in the second planarization layer 172. The first anode electrode 180 is exposed via the fourth contact hole (CH4), and the first auxiliary electrode 190 is exposed via the fifth contact hole (CH5).

The second anode electrode 200 is provided on the second planarization layer 172. The second anode electrode 200 is connected with the first anode electrode 180 via the fourth contact hole (CH4). The second anode electrode 200 reflects light emitted from the organic emitting layer 240 to an upper direction. In this respect, the second anode electrode 200 is formed of a material with good reflectance. The second anode electrode 200 may include a second lower anode electrode 201, a second central anode electrode 202, and a second upper anode electrode 203.

The second lower anode electrode 201 is provided between the first anode electrode 180 and the second central anode electrode 202. The second lower anode electrode 201 protects a lower surface of the second central anode electrode 202 so that it is possible to prevent the lower surface of the second central anode electrode 202 from being corroded. Thus, an oxidation degree of the second lower anode electrode 201 may be lower than an oxidation degree of the second central anode electrode 202. That is, a corrosion resistance in a material of the second lower anode electrode 201 may be superior to a corrosion resistance in a material of the second central anode electrode 202. The second lower anode electrode 201 may be formed of a transparent conductive material such as indium-tin-oxide (ITO), but not limited to this material.

The second central anode electrode 202 is provided between the second lower anode electrode 201 and the second upper anode electrode 203. The second central anode electrode 202 may be formed of a metal material with relatively-low resistance and relatively-high reflectance in comparison to the second lower anode electrode 201 and the second upper anode electrode 203, for example, argentums (Ag), but is not limited to this material. In order to lower a total resistance of the second anode electrode 200, a thickness of the second central anode electrode 202 with relatively-low resistance is larger than a thickness in each of the second lower anode electrode 201 and the second upper anode electrode 203 with relatively-high resistance, preferably.

The second upper anode electrode 203 is provided on an upper surface of the second central anode electrode 202 so that it is possible to prevent the upper surface of the second central anode electrode 202 from being corroded. Thus, an oxidation degree of the second upper anode electrode 203 may be lower than an oxidation degree of the second central anode electrode 202. That is, a corrosion resistance in a material of the second upper anode electrode 203 may be superior to a corrosion resistance in a material of the second central anode electrode 202. The second upper anode electrode 203 may be formed of a transparent conductive material such as indium-tin-oxide (ITO), but is not limited to this material.

In the same way as the second anode electrode 200, the second auxiliary electrode 210 is provided on the second planarization layer 172. The second auxiliary electrode 210 is connected with the first auxiliary electrode 190 via the fifth contact hole (CH5). The second auxiliary electrode 210 together with the first auxiliary electrode 190 lowers a resistance of the cathode electrode 250.

The second auxiliary electrode 210 may include a second lower auxiliary electrode 211, a second central auxiliary electrode 212, and a second upper auxiliary electrode 213.

The second lower auxiliary electrode 211 is provided between the first auxiliary electrode 190 and the second central auxiliary electrode 212. The second lower auxiliary electrode 211 protects a lower surface of the second central auxiliary electrode 212 so that it is possible to prevent the lower surface of the second central auxiliary electrode 212 from being corroded. Thus, an oxidation degree of the second lower auxiliary electrode 211 may be lower than an oxidation degree of the second central auxiliary electrode 212. That is, a corrosion resistance in a material of the second lower auxiliary electrode 211 may be superior to a corrosion resistance in a material of the second central auxiliary electrode 212. The second lower auxiliary electrode 211 may be formed of a transparent conductive material such as indium-tin-oxide (ITO), but not limited to this material.

The second central auxiliary electrode 212 is provided between the second lower auxiliary electrode 211 and the second upper auxiliary electrode 213. The second central auxiliary electrode 212 may be formed of a material with relatively-low resistance and relatively-high reflectance in comparison to the second lower auxiliary electrode 211 and the second upper auxiliary electrode 213, for example, argentums (Ag), but is not limited to this material. In order to lower a total resistance of the second auxiliary electrode 210, a thickness of the second central auxiliary electrode 212 with relatively-low resistance is larger than a thickness in each of the second lower auxiliary electrode 211 and the second upper auxiliary electrode 213 with relatively-high resistance, preferably.

The second upper auxiliary electrode 213 is provided on an upper surface of the second central auxiliary electrode 212 so that it is possible to prevent the upper surface of the second central auxiliary electrode 212 from being corroded. Thus, an oxidation degree of the second upper auxiliary electrode 213 may be lower than an oxidation degree of the second central auxiliary electrode 212. That is, a corrosion resistance in a material of the second upper auxiliary electrode 213 may be superior to a corrosion resistance in a material of the second central auxiliary electrode 212. The second upper auxiliary electrode 213 may be formed of a transparent conductive material such as indium-tin-oxide (ITO), but is not limited to this material.

The second upper auxiliary electrode 213 may be formed of the same material as that of the second upper anode electrode 203, and the second upper auxiliary electrode 213 may be formed in the same thickness as that of the second upper anode electrode 203. The second central auxiliary electrode 212 may be formed of the same material as that of the second central anode electrode 202, and the second central auxiliary electrode 212 may be formed in the same thickness as that of the second central anode electrode 202. The second lower auxiliary electrode 211 may be formed of the same material as that of the second lower anode electrode 201, and the second lower auxiliary electrode 211 may be formed in the same thickness as that of the second lower anode electrode 201. In this case, the second auxiliary electrode 210 and the second anode electrode 200 may be simultaneously manufactured in the same process.

According to one embodiment of the present invention, there are the two auxiliary electrodes of the first auxiliary electrode 190 and the second auxiliary electrode 210 which are connected with each other so as to lower the resistance of the cathode electrode 250, which facilitates a control of the resistance properties required for the auxiliary electrode.

In more detail, the second auxiliary electrode 210 is formed in the same layer as the second anode electrode 200. Thus, if the second auxiliary electrode 210 is increased in its width, it is necessary to decrease a width of the second anode electrode 200, to thereby decrease a pixel region in a display device. There is a limitation on the amount of increase in the width of the second auxiliary electrode 210. According to one embodiment of the present invention, the first auxiliary electrode 190 connected with the second auxiliary electrode 210 is additionally provided below the second auxiliary electrode 210 so that it is possible to lower the resistance of the cathode electrode 250 efficiently without decreasing the pixel region.

The first auxiliary electrode 190 is formed in the same layer as the first anode electrode 180. As the first anode electrode 180 connects the source electrode 150 and the second anode electrode 200 with each other, it is possible to decrease a width of the first anode electrode 180, thereby increasing a width of the first auxiliary electrode 190. That is, the width of the first auxiliary electrode 190 may be larger than the width of the first anode electrode 180, and furthermore, the width of the first auxiliary electrode 190 is increased so as to be overlapped with the second anode electrode 200 so that it is possible to lower the resistance of the cathode electrode 250 efficiently.

The bank 220 is provided on the second anode electrode 200 and the second auxiliary electrode 210.

The bank 220, which exposes the upper surface of the second anode electrode 200, is provided on one side and another side opposite the one side of the second anode electrode 200. As the bank 220 is provided to expose the upper surface of the second anode electrode 200, it is possible to secure an image-displaying area. Also, the bank 220 is provided on one side and the other side of the second anode electrode 200 so that it is possible to prevent the lateral surface of the second central anode electrode 202 from being exposed externally, since the lateral surface of the second central anode electrode 202 is relatively vulnerable to corrosion, thereby preventing the lateral surface of the second central anode electrode 202 from being corroded.

The bank 220, which exposes the upper surface of the second auxiliary electrode 210, is provided on one side and the other side of the second auxiliary electrode 210. As the bank 220 is provided to expose the upper surface of the second auxiliary electrode 210, it is possible to secure an electrical connection space between the second auxiliary electrode 210 and the cathode electrode 250. Also, the bank 220 is provided on one side and the other side of the second auxiliary electrode 210 so that it is possible to prevent the lateral surface of the second central auxiliary electrode 212 from being exposed externally, since the lateral surface of the second central auxiliary electrode 212 is relatively vulnerable to corrosion, thereby preventing the lateral surface of the second central auxiliary electrode 212 from being corroded.

Also, the bank 220 is provided between the second anode electrode 200 and the second auxiliary electrode 210, to thereby insulate the second anode electrode 200 and the second auxiliary electrode 210 from each other. The bank 220 may be formed of an organic insulating material, for example, polyimide resin, acryl resin, benzocyclobutene BCB, and etc., but is not limited to these materials.

The partition 230 is provided on the second auxiliary electrode 210. The partition 230 is provided at a predetermined interval from the bank 220, and the second auxiliary electrode 210 and the cathode electrode 250 are electrically connected with each other through the space between the partition 230 and the bank 220. The second auxiliary electrode 210 and the cathode electrode 250 may be electrically connected with each other without forming the partition 230. However, if the partition 230 is formed, it facilitates a deposition process of the organic emitting layer 240. This will be described in detail as follows.

In case the partition 230 is not formed, it is necessary to provide a mask pattern for covering the upper surface of the second auxiliary electrode 210 when the organic emitting layer 240 is deposited to prevent the upper surface of the second auxiliary electrode 210 from being covered by the organic emitting layer 240. However, if forming the partition 230, an upper surface of the partition 230 serves as an eaves for the deposition process of the organic emitting layer 240. Thus, the organic emitting layer 240 is not deposited in an area below the eaves so that there is no need to provide the mask pattern for covering the upper surface of the second auxiliary electrode 210. From a front view, if the upper surface of the partition 230 serving as the eaves is configured to cover the space between the partition 230 and the bank 220, it is possible to prevent the organic emitting layer 240 from penetrating the space between the partition 230 and the bank 220. Thus, the second auxiliary electrode 210 may be exposed in the space between the partition 230 and the bank 220. Especially, the organic emitting layer 240 may be manufactured by an evaporation method using a deposition material with superior linearity. Thus, the organic emitting layer 240 is not deposited in the space between the partition 230 and the bank 220 for the deposition process of the organic emitting layer 240.

As described above, in order to provide the partition 230 serving as the eaves, a width in the upper surface of the partition 230 is larger than a width in the lower surface of the partition 230. The partition 230 may include a first partition 231 of the lower side and a second partition 232 of the upper side. The first partition 231 is provided on the upper surface of the second auxiliary electrode 210. The first partition 231 may be formed of the same material as that of the bank 220, and the first partition 231 and the bank 220 may be manufactured in the same process. The second partition 232 is provided on an upper surface of the first partition 231. A width in the upper surface of the second partition 232 is larger than a width in the lower surface of the second partition 232. Especially, the upper surface of the second partition 232 is configured to cover the space between the partition 230 and the bank 220, so the partition 230 serves as the eaves.

The organic emitting layer 240 is provided on the second anode electrode 200. The organic emitting layer 240 may include a hole injecting layer, a hole transporting layer, an emitting layer, an electron transporting layer, and an electron injecting layer. A structure of the organic emitting layer 240 may be changed to various shapes generally known to those in the art.

The organic emitting layer 240 may extend to the upper surface of the bank 220. However, when the organic emitting layer 240 extends to the upper surface of the bank 220, the upper surface of the second auxiliary electrode 210 is not covered by the organic emitting layer 240. If the upper surface of the second auxiliary electrode 210 is covered by the organic emitting layer 240, it is difficult to electrically connect the second auxiliary electrode 210 and the cathode electrode 250 with each other. As described above, the organic emitting layer 240 may be manufactured for the deposition process without using the mask for covering the upper surface of the second auxiliary electrode 210. In this case, the organic emitting layer 240 may be provided on the upper surface of the partition 230.

The cathode electrode 250 is provided on the organic emitting layer 240. As the cathode electrode 250 is provided on a surface from which light is emitted, the cathode electrode 250 is formed of a transparent conductive material. Thus, a resistance of the cathode electrode 250 is increased since the cathode electrode 250 is formed of the transparent conductive material. In order to lower the resistance of the cathode electrode 250, the cathode electrode 250 is connected with the second auxiliary electrode 210. That is, the cathode electrode 250 is connected with the second auxiliary electrode 210 via the space between the partition 230 and the bank 220. The cathode electrode 250 may be manufactured by sputtering, that is, a deposition process using a deposition material with inferior linearity. Accordingly, the cathode electrode 250 may be deposited in the space between the partition 230 and the bank 220 for the deposition process of the cathode electrode 250.

Although not shown, an encapsulation layer for preventing a permeation of moisture may be additionally provided on the cathode electrode 250. The encapsulation layer may be formed of various materials generally known to those in the art. Although not shown, a color filter for each pixel may be additionally provided on the cathode electrode 250. In this case, a white light may be emitted from the organic emitting layer 240.

In the pad area (PA) of the substrate 100, there is a gate insulating film 120, a first signal pad 300, an insulating interlayer 140, a second signal pad 400, a passivation layer 165, a first pad electrode 500, and a second pad electrode 600.

The gate insulating film 120 is provided on the substrate 100. The gate insulating film 120, which extends from the active area (AA), is formed on an entire surface of the pad area (PA).

The first signal pad 300 is provided on the gate insulating film 120. The first signal pad 300 may be formed of the same material as that of the gate electrode 130 of the active area (AA), and may be formed in the same layer as the gate electrode 130 of the active area (AA).

The insulating interlayer 140 is provided on the first signal pad 300. The insulating interlayer 140, which extends from the active area (AA), is provided on the pad area (PA). A sixth contact hole (CH6) is provided in the insulating interlayer 140, and the first signal pad 300 is exposed via the sixth contact hole (CH6).

The second signal pad 400 is provided on the insulating interlayer 140. The second signal pad 400 is connected with the first signal pad 300 via the sixth contact hole (CH6). The second signal pad 400 may be formed in the same layer as the source and drain electrodes 150 and 160 of the active area (AA).

The second signal pad 400 may include a second lower signal pad 401 and a second upper signal pad 402.

The second lower signal pad 401 is provided between the insulating interlayer 140 and the second upper signal pad 402, wherein the second lower signal pad 401 enhances an adhesive strength between the insulating interlayer 140 and the second upper signal pad 402. Also, the second lower signal pad 401 prevents a lower surface of the second upper signal pad 402 from being corroded. Thus, an oxidation degree of the second lower signal pad 401 may be lower than an oxidation degree of the second upper signal pad 402. That is, a corrosion resistance in a material of the second lower signal pad 401 may be superior to a corrosion resistance in a material of the second upper signal pad 402. The second lower signal pad 401 may be formed of the same material as that of the lower source electrode 151 or lower drain electrode 161, for example, an alloy MoTi of molybdenum (Mo) and titanium (Ti), but is not limited to this material.

The second upper signal pad 402 is provided on an upper surface of the second lower signal pad 401. The second upper signal pad 402 may be formed of a low-resistance metal material such as copper (Cu), but is not limited to this metal material. The second upper signal pad 402 may be formed of a metal material whose resistance is relatively lower than that of the second lower signal pad 401. In order to lower a total resistance of the second signal pad 400, a thickness of the second upper signal pad 402 is larger than a thickness of the second lower signal pad 401, preferably.

The second upper signal pad 402 may be formed of the same material as that of the upper source electrode 152 and/or upper drain electrode 162, and may be formed in the same thickness as the upper source electrode 152 and/or upper drain electrode 162. The second lower signal pad 401 may be formed of the same material as that of the lower source electrode 151 and/or lower drain electrode 161, and may be formed in the same thickness as the lower source electrode 151 and/or lower drain electrode 161. In this case, the second signal pad 400 and the source electrode 150 and/or drain electrode 160 may be simultaneously manufactured in the same process.

The passivation layer 165 is provided on the second signal pad 400. The passivation layer 165 extends from the active area (AA). A seventh contact hole (CH7) for exposing a predetermined part of the second signal pad 400 is provided in the passivation layer 165.

The first pad electrode 500 is provided on the passivation layer 165. The first pad electrode 500 is connected with the second signal pad 400 via the seventh contact hole (CH7).

The first pad electrode 500 protects an upper surface of the second signal pad 400. The upper surface of the second signal pad 400 is formed of the second upper signal pad 402 which is relatively vulnerable to corrosion. For this reason, the first pad electrode 500 is provided to cover the upper surface of the second upper signal pad 402 which is exposed via the seventh contact hole (CH7), thereby preventing the second upper signal pad 402 from being corroded. The first pad electrode 500 prevents the upper surface of the second upper signal pad 402 from being corroded. Thus, it is possible to provide the aforementioned dual-layered structure in the second signal pad 400.

An oxidation degree of the first pad electrode 500, especially, an oxidation of the first cover pad electrode 503 may be lower than an oxidation degree of the second upper signal pad 402. That is, a corrosion resistance in a material of the first pad electrode 500, especially, the first cover pad electrode 503 may be superior to a corrosion resistance in a material of the second upper signal pad 402.

The first pad electrode 500 may be formed of the same material as that of the first anode electrode 180 and/or first auxiliary electrode 190, and may be formed in the same thickness as the first anode electrode 180 and/or first auxiliary electrode 190. In this case, the first pad electrode 500 and the first anode electrode 180 and/or first auxiliary electrode 190 may be simultaneously manufactured in the same mask process or in a same layer.

The first pad electrode 500 may include a first lower pad electrode 501, a first upper pad electrode 502, and a first cover pad electrode 503.

The first lower pad electrode 501 is provided to cover the upper surface of the second upper signal pad 402 via the seventh contact hole (CH7) so that it is possible to prevent the second upper signal pad 402 from being corroded. Thus, an oxidation degree of the first lower pad electrode 501 is lower than an oxidation degree of the second upper signal pad 402. That is, a corrosion resistance in a material of the first lower pad electrode 501 may be superior to a corrosion resistance in a material of the second upper signal pad 402. The first lower pad electrode 501 prevents the upper surface of the second upper signal pad 402 from being corroded so that it is possible to provide the aforementioned dual-layered structure in the second signal pad 400. Moreover, the first lower pad electrode 501 protects a lower surface of the first upper pad electrode 502 so that it is possible to prevent the lower surface of the first upper pad electrode 502 from being corroded. Thus, an oxidation degree of the first lower pad electrode 501 may be lower than an oxidation degree of the first upper pad electrode 502.

The first lower pad electrode 501 may be formed of the same material as that of the first lower anode electrode 181 and/or first lower auxiliary electrode 191, for example, an alloy MoTi of molybdenum (Mo) and titanium (Ti), but is not limited to this material. The first lower pad electrode 501 may be formed of the same material as that of the first lower anode electrode 181 and/or first lower auxiliary electrode 191, and may be formed in the same thickness as that of the first lower anode electrode 181 and/or first lower auxiliary electrode 191. In this case, the first lower pad electrode 501 and the first lower anode electrode 181 and/or first lower auxiliary electrode 191 may be simultaneously patterned in the same mask process.

The first upper pad electrode 502 is provided between the first lower pad electrode 501 and the first cover pad electrode 503. The first upper pad electrode 502 may be formed of a low-resistance material such as copper (Cu), but is not limited to this material. The first upper pad electrode 502 may be formed of a metal material whose resistance is relatively lower than that in each of the first lower pad electrode 501 and the first cover pad electrode 503. In order to lower a total resistance of the first pad electrode 500, a thickness of the first upper pad electrode 502 is larger than a thickness in each of the first lower pad electrode 501 and the first cover pad electrode 503, preferably. The first upper pad electrode 502 may be formed of the same material as that of the first upper anode electrode 182 and/or first upper auxiliary electrode 192, and may be formed in the same thickness as that of the first upper anode electrode 182 and/or first upper auxiliary electrode 192.

The first cover pad electrode 503 is provided on the first upper pad electrode 502. The first cover pad electrode 503 covers upper and lateral surfaces of the first upper pad electrode 502 so that the first cover pad electrode 503 prevents the first upper pad electrode 502 from being corroded. That is, the first cover pad electrode 503 prevents the first upper pad electrode 502 from being exposed externally. Accordingly, an oxidation degree of the first cover pad electrode 503 may be lower than an oxidation degree of the first upper pad electrode 502. That is, a corrosion resistance in a material of the first cover pad electrode 503 may be superior to a corrosion resistance in a material of the first upper pad electrode 502.

The first cover pad electrode 503 also covers lateral surfaces of the first lower pad electrode 501. In this case, an oxidation degree of the first cover pad electrode 503 may be lower than an oxidation degree of the first lower pad electrode 501. That is, a corrosion resistance in a material of the first cover pad electrode 503 may be superior to a corrosion resistance in a material of the first lower pad electrode 501. The first cover pad electrode 503 may be formed of a transparent conductive material such as indium-tin-oxide (ITO), but is not limited to this material. The first cover pad electrode 503 may be formed of the same material as that of the first cover anode electrode 183 and/or first cover auxiliary electrode 193, and may be formed in the same thickness as that of the first cover anode electrode 183 and/or first cover auxiliary electrode 193. In this case, the first cover pad electrode 503 and the first cover anode electrode 183 and/or first cover auxiliary electrode 193 may be simultaneously patterned in the same mask process.

The second pad electrode 600 is provided on the first pad electrode 500. The second pad electrode 600 is in a direct contact with the upper surface of the first pad electrode 500. The second pad electrode 600 is exposed externally, and is connected with an external driver.

The second pad electrode 600 may include a second lower pad electrode 601, a second central pad electrode 602, and a second upper pad electrode 603.

The second pad electrode 600 may be formed of the same material as that of the second anode electrode 200 and/or second auxiliary electrode 210, and may be formed in the same thickness as the second anode electrode 200 and/or second auxiliary electrode 210. In this case, the second pad electrode 600 and the second anode electrode 200 and/or second auxiliary electrode 210 may be simultaneously manufactured in the same mask process or in a same layer.

The second lower pad electrode 601 is provided between the first cover pad electrode 503 and the second central pad electrode 602. The second lower pad electrode 601 protects a lower surface of the second central pad electrode 602 so that it is possible to prevent the lower surface of the second central pad electrode 602 from being corroded. Thus, an oxidation degree of the second lower pad electrode 601 may be lower than an oxidation degree of the second central pad electrode 602. That is, a corrosion resistance in a material of the second lower pad electrode 601 may be superior to a corrosion resistance in a material of the second central pad electrode 602. The second lower pad electrode 601 may be may be formed of a transparent conductive material such as indium-tin-oxide (ITO), but is not limited to this material.

The second central pad electrode 602 is provided between the second lower pad electrode 601 and the second upper pad electrode 603. The second central pad electrode 602 may be formed of a material with relatively-low resistance and relatively-high reflectance in comparison to the second lower pad electrode 601 and the second upper pad electrode 603, for example, argentums (Ag), but is not limited to this material. In order to lower a total resistance of the second pad electrode 600, a thickness of the second central pad electrode 602 with relatively-low resistance is larger than a thickness in each of the second lower pad electrode 601 and the second upper pad electrode 603 with relatively-high resistance, preferably.

The second upper pad electrode 603 is provided on an upper surface of the second central pad electrode 602 so that it is possible to prevent the upper surface of the second central pad electrode 602 from being corroded. Thus, an oxidation degree of the second upper pad electrode 603 may be lower than an oxidation degree of the second central pad electrode 602. That is, a corrosion resistance in a material of the second upper pad electrode 603 may be superior to a corrosion resistance in a material of the second central pad electrode 602. The second upper pad electrode 603 may be formed of a transparent conductive material such as indium-tin-oxide (ITO), but is not limited to this material.

The second upper pad electrode 603 may be formed of the same material as that of the second upper anode electrode 203 and/or second upper auxiliary electrode 213, and may be formed in the same thickness as that of the second upper anode electrode 203 and/or second upper auxiliary electrode 213. The second central pad electrode 602 may be formed of the same material as that of the second central anode electrode 202 and/or second central auxiliary electrode 212, and may be formed in the same thickness of the second central anode electrode 202 and/or second central auxiliary electrode 212. The second lower pad electrode 601 may be formed of the same material as that of the second lower anode electrode 201 and/or second lower auxiliary electrode 211, and may be formed in the same thickness as that of the second lower anode electrode 201 and/or second lower auxiliary electrode 211. In this case, the second pad electrode 600, the second auxiliary electrode 210 and the second anode electrode 200 may be simultaneously patterned in the same process.

Figure 4:
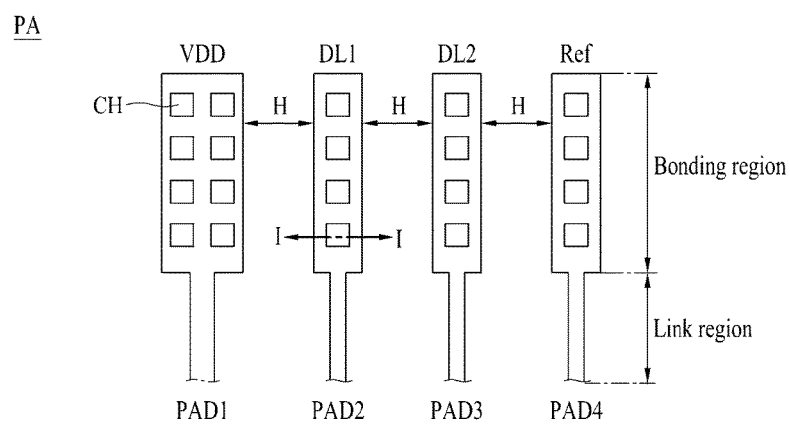
FIG. 4 is a plane view illustrating a pad area in the organic light emitting display device, according to one embodiment of the present invention.

FIG. 4 is a plane view illustrating the pad area (PA) of the organic light emitting display device according to one embodiment of the present invention.

As shown in FIG. 4, the pad area (PA) is provided with a first pad (PAD1), a second pad (PAD2), a third pad (PAD3), and a fourth pad (PAD4).

The first pad (PAD1) is connected with the power source line (VDD) of the aforementioned active area (AA), the second pad (PAD2) is connected with the first data line (DL1) of the aforementioned active area (AA), the third pad (PAD3) is connected with the second data line (DL2) of the aforementioned active area (AA), and the fourth pad (PAD4) is connected with the reference line (Ref) of the aforementioned active area (AA).

Each of the first pad (PAD1), the second pad (PAD2), the third pad (PAD3), and the fourth pad (PAD4) may include a bonding region and a link region.

The bonding region is bonded to an external driving circuit, and the link region is provided to connect the bonding region and the aforementioned active area (AA) with each other. A plurality of contact hole (CH) areas may be provided in the bonding region. The aforementioned sixth contact hole (CH6) and seventh contact hole (CH7) are provided in each of the plurality of contact hole (CH) areas. That is, in FIG. 4, a cross section along line I-I' crossing the contact hole (CH) area corresponds to a cross section of the pad area (PA) of FIG. 3. Accordingly, each of the plurality of contact hole (CH) areas is provided with the first signal pad 300, the second signal pad 400 connected with the first signal pad 300 via the sixth contact hole (CH6), the first pad electrode 500 connected with the second signal pad 400 via the seventh contact hole (CH7), and the second pad electrode 600 connected with the first pad electrode 500, as shown in FIG. 3. Thus, the external circuit may be bonded to a top-most pad electrode of the first, second, third, and fourth pads in the bonding regions of the pads, and the pad electrode may be electrically connected to the link region through one or more contact holes in the bonding regions. The link region is electrically connected to one or more signal lines in the active area. The signal lines may be at least one of a power source line, a data line, a gate line, or a reference line.

In the plurality of contact hole (CH) areas, the sixth contact hole (CH6) and the seventh contact hole (CH7) are provided therein, and also the first signal pad 300, the second signal pad 400, the first pad electrode 500, and the second pad electrode 600 are sequentially deposited therein. Thus, in consideration of a processing margin for each layer, there is a limitation on the amount of decrease for the width of the bonding region. Accordingly, an interval (H) between each of the bonding regions is decreased so that there is a possibility of error for the bonding process of bonding the external driving circuit to the bonding region.

Accordingly, there has been a need for ways to increase the interval (H) between each of the bonding regions. Hereinafter, an organic light emitting display device according to another embodiment of the present invention, which enables an increase in the interval (H) between each of the bonding regions, will be described in detail as follows.

Figure 5:
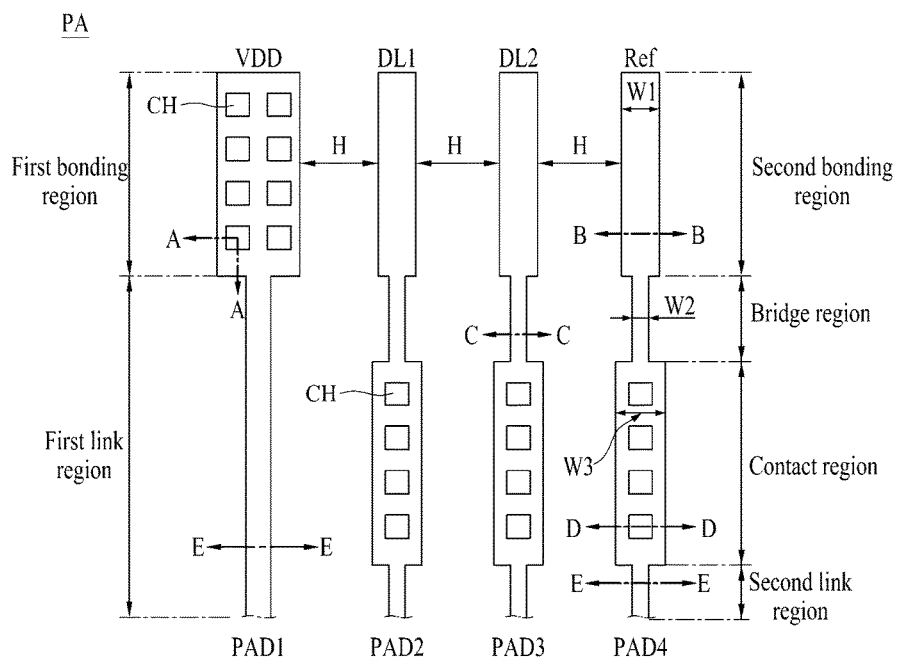
FIG. 5 is a plane view illustrating a pad area in an organic light emitting display device, according to another embodiment of the present invention.

FIG. 5 is a plane view illustrating a pad area (PA) of an organic light emitting display device according to another embodiment of the present invention.

As shown in FIG. 5, the pad area (PA) is provided with a first pad (PAD1), a second pad (PAD2), a third pad (PAD3), and a fourth pad (PAD4).

The first pad (PAD1) is connected with the power source line (VDD) of the aforementioned active area (AA), the second pad (PAD2) is connected with the first data line (DL1) of the aforementioned active area (AA), the third pad (PAD3) is connected with the second data line (DL2) of the aforementioned active area (AA), and the fourth pad (PAD4) is connected with the reference line (Ref) of the aforementioned active area (AA).

The first pad (PAD1) may include a first bonding region and a first link region. Also, each of the second pad (PAD2), the third pad (PAD3) and the fourth pad (PAD4) may include a second bonding region, a bridge region, a contact region, and a second link region.

Figure 7:
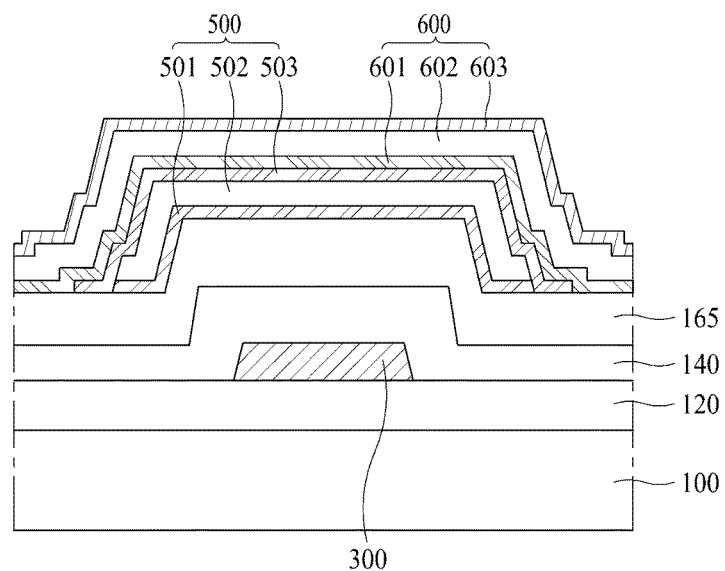
FIG. 7 is a cross sectional view along line B-B or line C-C of FIG. 5, according to one embodiment of the present invention.
Figure 8:
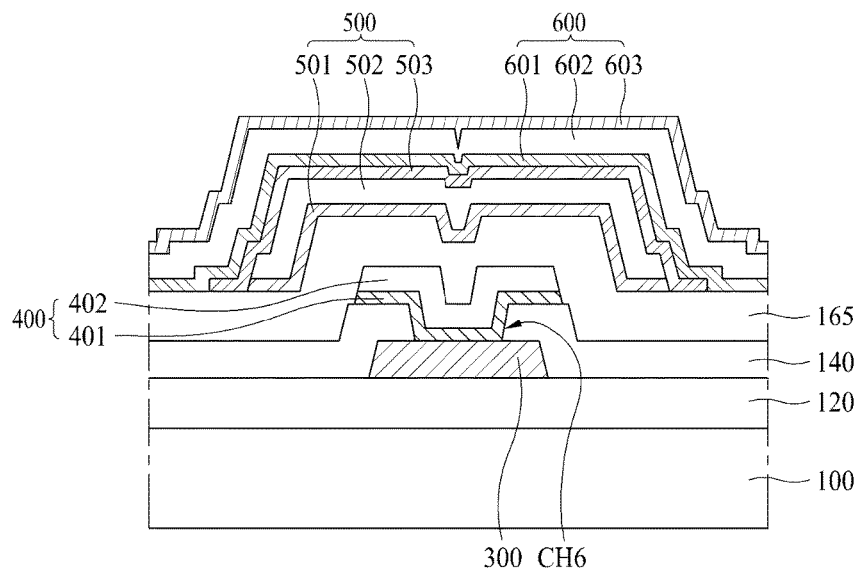
FIG. 8 is a cross sectional view along line B-B or line C-C of FIG. 5, according to another embodiment of the present invention.

The first bonding region and the second bonding regions are bonded to an external driving circuit. That is, the external driving circuit may be bonded to a top-most pad electrode of the first pad (PAD1) in the first bonding region, and top-most pad electrodes of the second pad (PAD2), third pad (PAD3), and the fourth pad (PAD4) in the second bonding regions. In this case, at least one contact hole (CH) area may be provided in the first bonding region of the first pad (PAD1). However, as shown in FIG. 7, it is possible that at least one contact hole (CH) area is not provided in the second bonding region of each of the second pad (PAD2), the third pad (PAD3), and the fourth pad (PAD4). Also, as shown in FIG. 8, it is possible that the sixth contact hole (CH6) is provided in the second bonding region of each of the second pad (PAD2), the third pad (PAD3), and the fourth pad (PAD4), and the seventh contact hole (CH7) is not provided in the second bonding region of each of the second pad (PAD2), the third pad (PAD3), and the fourth pad (PAD4).

Accordingly, it is possible to decrease a width (W1) of the second bonding region in each of the second pad (PAD2), the third pad (PAD3), and the fourth pad (PAD4). As a result, in comparison to the embodiment shown in FIG. 4, the embodiment shown in FIG. 5 enables an increase in the interval (H) between each of the second bonding regions, making it possible to prevent errors in a bonding process of the external driving circuit to the first and second bonding regions.

The bridge region included in each of the second pad (PAD2), the third pad (PAD3), and the fourth pad (PAD4) is provided to electrically connect the second bonding region and the contact region with each other. As shown in FIG. 7, it is possible that at least one contact hole (CH) area is not provided in the bridge region of each of the second pad (PAD2), the third pad (PAD3), and the fourth pad (PAD4). As shown in FIG. 8, it is possible that the sixth contact hole (CH6) is provided in the bridge region of each of the second pad (PAD2), the third pad (PAD3), and the fourth pad (PAD4), and the seventh contact hole (CH7) is not provided in the bridge region of each of the second pad (PAD2), the third pad (PAD3), and the fourth pad (PAD4). Accordingly, it is possible to decrease a width (W2) of the bridge region in each of the second pad (PAD2), the third pad (PAD3) and the fourth pad (PAD4). Especially, the width (W2) of the bridge region may be smaller than the width (W1) of the second bonding region or the width of the contact region. As the external driving circuit is bonded to the second bonding region, the width (W1) of the second bonding region should be a predetermined width or should be larger than the predetermined width. However, since the bridge region is provided to connect the second bonding region and the contact region with each other, the width (W2) of the bridge region may be smaller than the width (W1) of the second bonding region or the width of the contact region. If needed, it is possible to omit the bridge region.

The contact region included in each of the second pad (PAD2), the third pad (PAD3), and the fourth pad (PAD4) is provided between the bridge region and the second link region. At least one contact hole (CH) area is provided in the contact region of each of the second pad (PAD2), the third pad (PAD3), and the fourth pad (PAD4), and the sixth and seventh contact holes (CH6, CH7) are provided in at least one contact hole (CH) area. According to the embodiment shown in FIG. 5, at least one contact hole (CH) area is provided in the contact region of each of the second pad (PAD2), the third pad (PAD3), and the fourth pad (PAD4) so that it is possible to decrease the width (W1) of the second bonding region, to thereby increase the interval (H) between each of the second bonding regions. That is, according to one embodiment of the present invention, the number of contact holes provided in the second bonding region is smaller than the number of contact holes provided in the contact region, whereby it is possible to decrease the width (W1) of the second bonding region, thereby increasing the interval (H) between each of the second bonding regions. In one embodiment, the number of contact holes in the first bonding region may be larger than the number of contact holes in the contact region.

As the sixth and seventh contact holes (CH6, CH7) are provided in the contact region, a width (W3) of the contact region is larger than the width (W1) of the second bonding region. The external driving circuit is not bonded to the contact region. Thus, even though the width (W3) of the contact region is larger than the width (W1) of the second bonding region, there is no possibility of processing errors. In one embodiment, a width of the first bonding region may be larger than the width of the contact region.

The first link region and the second link region are provided to respectively connect the first bonding region and the second bonding region with the aforementioned active area (AA). The first link region and the second link region may be electrically connected to one or more signal lines in the active area. For example, the signal lines may be any one of a power source line, a data line, a gate line, or a reference line. The first link region of the first pad (PAD1) is electrically connected with the first bonding region, and the second link region included in each of the second pad (PAD2), the third pad (PAD3), and the fourth pad (PAD4) is electrically connected with the contact region. In the second to fourth pads (PAD2 to PAD 4), the second link region is electrically connected with the contact region, and the contact region is electrically connected with the second bonding region via the bridge region so that it is possible to increase the width (W3) of the contact region, and also to decrease the width (W1) of the second bonding region, thereby enabling a structure for preventing processing errors.

Thus, the external circuit may be bonded to a top-most pad electrode in the first bonding region of the first pad (PAD1), and the pad electrode of the first pad (PAD1) may be electrically connected to the first link region through one or more contact holes in the first bonding region. The first link region is electrically connected to one or more signal lines in the active area. The signal lines may be at least one of a power source line, a data line, a gate line, or a reference line.

The external circuit may also be bonded to top-most pad electrodes in the second bonding region of the second pad (PAD2), third pad (PAD3), and the fourth pad (PAD4). Each of the pad electrodes in the second bonding region may be electrically connected to signal lines in the active area through one or more contact holes in the contact region. The contact region may be closer to the active area than the first bonding region. An additional bridge region may connect the second bonding region and the contact region.

As described above, according to the embodiment shown in FIG. 5, each of the second pad (PAD2), the third pad (PAD3) and the fourth pad (PAD4) includes the second bonding region, the bridge region, the contact region and the second link region, and the contact hole (CH) are is provided in the contact region, whereby it is possible to decrease the width (W1) of the second bonding region, thereby increasing the interval (H) between each of the second bonding regions.

FIG. 5 shows that the first bonding region of the first pad (PAD1) is provided with the plurality of contact hole (CH) areas, and the second bonding region of each of the second to fourth pads (PAD2 to PAD4) is not provided with the plurality of contact hole (CH) areas, but is not limited to this structure. For example, in the same way as the first pad (PAD1), the third pad (PAD3) may include the first bonding region with the plurality of contact hole (CH) areas and the first link region, whereby the plurality of contact hole (CH) areas may be patterned in a zigzag configuration on the entire regions of the first to fourth pads (PAD 1 to PAD4).

Hereinafter, a cross sectional structure of the first pad (PAD1) comprising the first bonding region and the first link region, and a cross sectional structure of each of the second pad (PAD2), the third pad (PAD3), and the fourth pad (PAD4) comprising the second bonding region, the bridge region, the contact region, and the second link region will be described in detail as follows.

Figure 6:
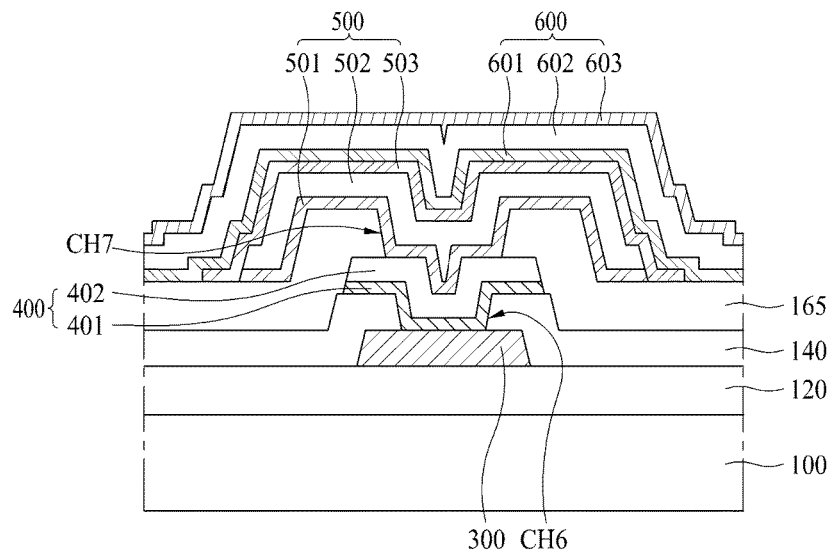
FIG. 6 is a cross sectional view along line A-A of FIG. 5.

FIG. 6 is a cross sectional view along the A-A line of FIG. 5, which corresponds to a cross sectional structure showing one embodiment of the first bonding region provided in the first pad (PAD1).

As shown in FIG. 6, a gate insulating film 120, a first signal pad 300, an insulating interlayer 140, a second signal pad 400, a passivation layer 165, a first pad electrode 500, and a second pad electrode 600 are provided in the first bonding region of the first pad (PAD1).

The gate insulating film 120 is provided on the substrate 100.

The first signal pad 300 is provided on the gate insulating film 120.

The insulating interlayer 140 is provided on the first signal pad 300. A sixth contact hole (CH6) is provided in the insulating interlayer 140, and the first signal pad 300 is exposed via the sixth contact hole (CH6).

The second signal pad 400 is provided on the insulating interlayer 140. The second signal pad 400 is connected with the first signal pad 300 via the sixth contact hole (CH6). The second signal pad 400 may include a second lower signal pad 401 and a second upper signal pad 402.

The passivation layer 165 is provided on the second signal pad 400. A seventh contact hole (CH7) is provided in the passivation layer 165, and the second signal pad 400 is exposed via the seventh contact hole (CH7).

The first pad electrode 500 is provided on the passivation layer 165. The first pad electrode 500 is connected with the second signal pad 400 via the seventh contact hole (CH7). The first pad electrode 500 may include a first lower pad electrode 501, a first upper pad electrode 502, and a first cover pad electrode 503.

The second pad electrode 600 is provided on the first pad electrode 500. The second pad electrode 600 is in a direct contact with an upper surface of the first pad electrode 500. The second pad electrode 600 is exposed externally, and is connected with an external driver. The second pad electrode 600 may include a second lower pad electrode 601, a second central pad electrode 602, and a second upper pad electrode 603.

The above cross sectional structure of the first bonding region of the first pad (PAD1) is identical to the cross sectional structure of the pad area (PA) shown in FIG. 3, whereby a detailed description for the same parts will be omitted. Hereinafter, the same reference numbers will be used throughout the drawings of FIGS. 7 to 11 to refer to the same or like parts, and a detailed description for the same parts will be omitted.

FIG. 7 is a cross sectional view along line B-B or line C-C, which corresponds to a cross sectional structure showing one embodiment of the second bonding region or bridge region provided in the second to fourth pads (PAD2 to PAD4).

As shown in FIG. 7, a gate insulating film 120, a first signal pad 300, an insulating interlayer 140, a passivation layer 165, a first pad electrode 500, and a second pad electrode 600 are sequentially provided in the second bonding region or bridge region of the second to fourth pads (PAD2 to PAD4).

In the second bonding region or bridge region of the second to fourth pads (PAD2 to PAD4), a sixth contact hole (CH6) is not formed in the insulating interlayer 140, a seventh contact hole (CH7) is not formed in the passivation layer 165, and a second signal pad 400 is not formed therein. This structure of the second bonding region or bridge region in the second to fourth pads (PAD2 to PAD4) is different from the structure of the bonding region in the first pad (PAD1). If needed, it is possible to omit the first signal pad 300. Also, it is possible to omit any one of the first pad electrode 500 and the second pad electrode 600. That is, at least one pad electrode 500 and 600 connected with the external driving circuit may be sufficient for the second bonding region and bridge region of the second to fourth pads (PAD2 to PAD4).

If there is a large height difference between the first bonding region of the first pad (PAD1) and the second bonding region of the second to fourth pads (PAD2 to PAD4), there is a possibility of error for the bonding process. Thus, it is desirable to prevent a large height difference between the first bonding region of the first pad (PAD1) and the second bonding region of the second to fourth pads (PAD2 to PAD4).

FIG. 8 shows a cross sectional structure of the second bonding structure of the second to fourth pads (PAD2 to PAD4), which is capable of minimizing the difference between the first bonding region of the first pad (PAD1) and the second bonding region of the second to fourth pads (PAD2 to PAD4).

FIG. 8 is a cross sectional view along line B-B or line C-C of FIG. 5, which corresponds to a cross sectional structure showing another embodiment of the second bonding region or bridge region provided in the second to fourth pads (PAD2 to PAD4).

As shown in FIG. 8, a gate insulating film 120, a first signal pad 300, an insulating interlayer 140, a second signal pad 400, a passivation layer 165, a first pad electrode 500, and a second pad electrode 600 are sequentially provided in the second bonding region or bridge region of the second to fourth pads (PAD2 to PAD4).

A sixth contact hole (CH6) is provided in the insulating interlayer 140, and the second signal pad 400 and the first signal pad 300 are connected with each other via the sixth contact hole (CH6).

In the above structure of FIG. 8, a seventh contact hole (CH7) is not provided in the passivation layer 165. In this respect, the second bonding region or bridge region of the second to fourth pads (PAD2 to PAD4) shown in FIG. 8 is different from the first bonding region of the first pad (PAD1). Thus, in comparison to the structure of FIG. 7, the structure of FIG. 8 minimizes the difference between the first bonding region of the first pad (PAD1) and the second bonding region of the second to fourth pads (PAD2 to PAD4).

In case of the above structure shown in FIG. 7, the contact hole (CH) area is not provided in the second bonding region or bridge region of the second to fourth pads (PAD2 to PAD4). Meanwhile, in case of the structure shown in FIG. 8, the seventh contact hole (CH7) is not provided in the second bonding region or bridge region of the second to fourth pads (PAD2 to PAD4), however, the sixth contact hole (CH6) is provided in the second bonding region or bridge region of the second to fourth pads (PAD2 to PAD4).

In order to decrease the height difference between the first bonding region of the first pad (PAD1) and the second bonding region of the second to fourth pads (PAD2 to PAD4), the second bonding region provided in the second to fourth pads (PAD2 to PAD4) may be configured to have the structure of FIG. 8, and the bridge region provided in the second to fourth pads (PAD2 to PAD4), which is less influenced by the difference, may be configured to have the structure of FIG. 7.

Figure 9:
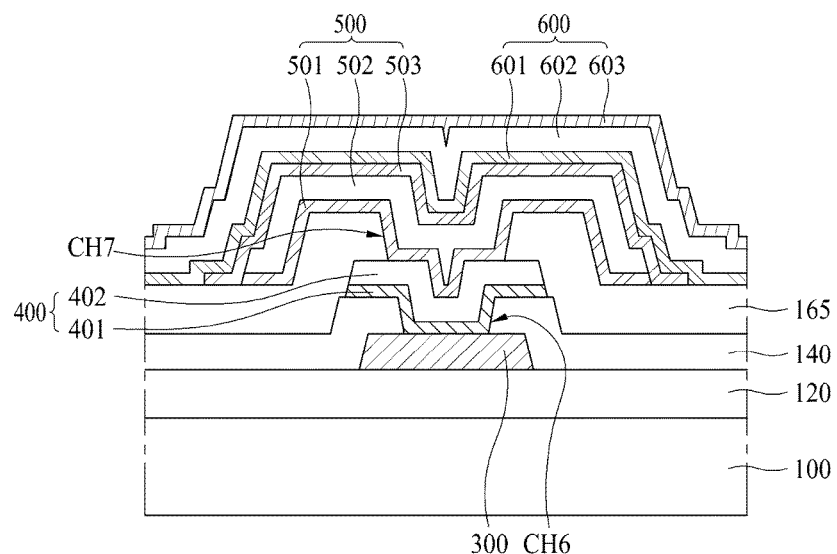
FIG. 9 is a cross sectional view along line D-D of FIG. 5, according to one embodiment of the present invention.

FIG. 9 is a cross sectional view along D-D line of FIG. 5, which corresponds to a cross sectional structure showing one embodiment of the contact region provided in the second to fourth pads (PAD2 to PAD4).

As shown in FIG. 9, a gate insulating film 120, a first signal pad 300, an insulating interlayer 140 with a sixth contact hole (CH6), a second signal pad 400, a passivation layer 165 with a seventh contact hole (CH7), a first pad electrode 500, and a second pad electrode 600 are sequentially provided in the contact region of the second to fourth pads (PAD2 to PAD4).

A cross sectional structure of the contact region provided in the second to fourth pads (PAD2 to PAD4) shown in FIG. 9 is identical to a cross sectional structure of the first bonding region provided in the first pad (PAD1) shown in FIG. 6, whereby a detailed description for the same parts will be omitted.

According to one embodiment of the present invention, a cross sectional structure of the first bonding region provided in the first pad (PAD1) is different from a cross sectional structure of the second bonding region provided in the second to fourth pads (PAD2 to PAD4), however, a cross sectional structure of the first bonding region provided in the first pad (PAD1) may be identical to a cross sectional structure of the contact region provided in the second to fourth pads (PAD2 to PAD4). That is, the first bonding region performs both bonding and contact functions at the same time, the second bonding region performs only the bonding function, and the contact region performs only the contact function so that it is possible to decrease a width (W1) of the second bonding region.

Figure 10:
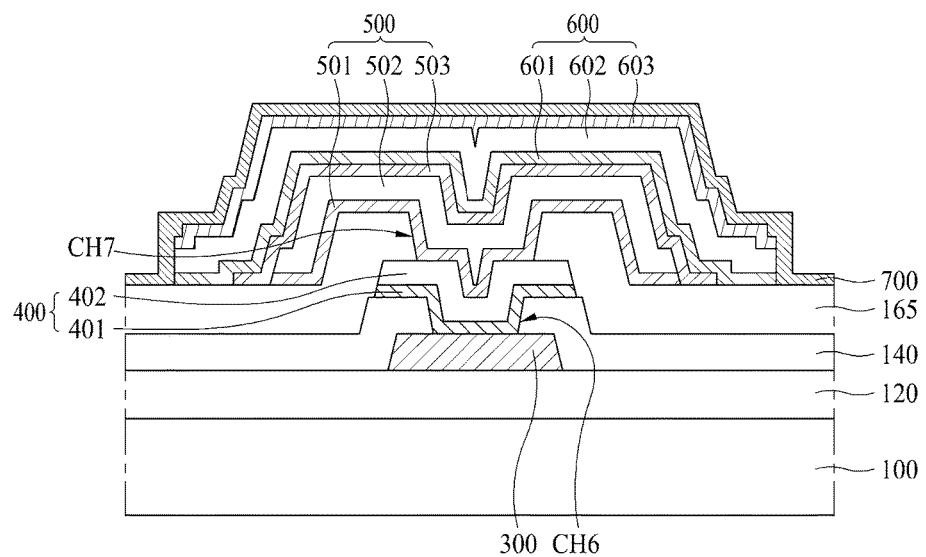
FIG. 10 is a cross sectional view along line D-D of FIG. 5, according to another embodiment of the present invention.

FIG. 10 is a cross sectional view along line D-D of FIG. 5, which corresponds to a cross sectional structure showing another embodiment of the contact region provided in the second to fourth pads (PAD2 to PAD4).

Except that a short preventing layer 700 provided on a second pad electrode 600, the contact region of FIG. 10 is identical to the contact region of FIG. 9.

The short preventing layer 700 is provided to prevent a short between each of the second to fourth pads (PAD2 to PAD4). This will be described with reference to FIG. 5. In order to bond the external driving circuit to the second bonding region, a conductive adhesive is coated onto the second bonding region, and the external driving circuit is pressed down onto the conductive adhesive and then bonded to the second bonding region. For the process of pressing the external driving circuit onto the conductive adhesive, if the conductive adhesive flows into the contact region via the bridge region, there may be a short between the neighboring contact regions.

Figure 11:
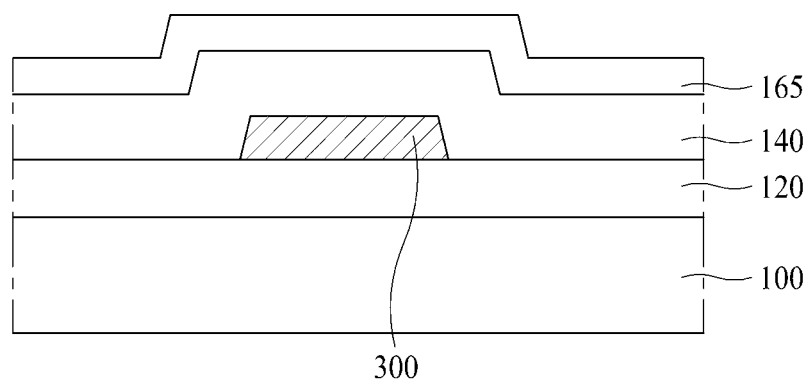
FIG. 11 is a cross sectional view along line E-E of FIG. 5, according to one embodiment of the present invention.

FIG. 11 is a cross sectional view along line E-E of FIG. 5, which corresponds to a cross sectional structure showing one embodiment of the first and second link regions provided in the first to fourth pads (PAD1 to PAD4).

As shown in FIG. 11, a gate insulating film 120, a first signal pad 300, an insulating interlayer 140, and a passivation layer 165 are sequentially provided in the first and second link regions on the substrate 100. The first signal pad 300 is connected with signal lines of the active area (AA).

According to one embodiment of the present invention, the second pad (PAD2) includes the second bonding region, the bridge region, the contact region and the second link region so that it is possible to decrease the contact area in the second bonding region, and thus to decrease the width of the second bonding region. Accordingly, the interval between each of the second bonding regions is increased so that it facilitates the bonding process in the pad region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising: a substrate with an active area and a pad area; a first anode electrode in the active area of the substrate; a second anode electrode on the first anode electrode, the second anode electrode being electrically connected to the first anode electrode; an organic emitting layer on the second anode electrode; a cathode electrode on the organic emitting layer; a first auxiliary electrode in a same layer as the first anode electrode; a second auxiliary electrode in a same layer as the second anode electrode, the second auxiliary electrode being electrically connected to the first auxiliary electrode and the cathode electrode, a first signal line and a second signal line in the active area; a first pad in the pad area and connected to the first signal line, wherein the first pad includes a link region electrically connected to the first signal line and a first bonding region connected to the link region, the first bonding region including one or more first contact holes for electrical connection with the link region; and a second pad in the pad area and connected to the second signal line, wherein the second pad includes a second bonding region corresponding to the first bonding region of the first pad and a contact region corresponding to the link region of the first pad, the contact region being electrically connected to the second bonding region and including one or more second contact holes for electrical connection with the second signal line.

2. The display device of claim 1, further comprising a planarization layer between the first anode electrode and the second anode electrode, and between the first auxiliary electrode and the second auxiliary electrode,
wherein the second anode electrode is electrically connected to the first anode electrode via a first contact hole provided in the planarization layer, and the second auxiliary electrode is electrically connected to the first auxiliary electrode via a second contact hole provided in the planarization layer.

3. The display device of claim 1, wherein a width of the first auxiliary electrode is larger than a width of the first anode electrode.

4. The display device of claim 1, wherein the first auxiliary electrode is overlapped with the second anode electrode.

5. The display device of claim 1, further comprising a bank covering a lateral surface of the second auxiliary electrode to expose an upper surface of the second auxiliary electrode, and a partition on the upper surface of the second auxiliary electrode, the partition having an interval from the bank,
- wherein the second auxiliary electrode and the cathode electrode are electrically connected with each other through a space between the partition and the bank.

6. The display device of claim 1, wherein the first anode electrode includes a first lower anode electrode, a first upper anode electrode on the first lower anode electrode, and a first cover anode electrode covering upper and lateral surfaces of the first upper anode electrode,
- wherein the first upper anode electrode is formed of a metal material whose resistance is lower than that in each of the first lower anode electrode and the first cover anode electrode, and wherein an oxidation degree of each of the first lower anode electrode and the first cover anode electrode is lower than an oxidation degree of the first upper anode electrode.

7. The display device of claim 1, wherein the second anode electrode includes a second lower anode electrode, a second central anode electrode on the second lower anode electrode, and a second upper anode electrode on the second central anode electrode,
- wherein the second central anode electrode is formed of a metal material whose resistance is lower than that in each of the second lower anode electrode and the second upper anode electrode, and wherein an oxidation degree of each of the second lower anode electrode and the second upper anode electrode is lower than an oxidation degree of the second central anode electrode.

8. The display device of claim 1, wherein the first auxiliary electrode is formed of the same material as the first anode electrode, and the second auxiliary electrode is formed of the same material as the second anode electrode.

9. The display device of claim 1,
- wherein the
  - wherein the first bonding region has a first bonding electrode, the first bonding region including the one or more first contact holes through which the first bonding electrode is electrically connected to the link region; and
- wherein the
  - wherein the second bonding region has a second bonding electrode and
  - the contact region has the one or more second contact holes through which the second bonding electrode is electrically connected to the second signal line, the contact region being closer to the active area than the first bonding region.

10. The display device of claim 9, wherein a width of the first bonding region of the first pad is greater than a width of the contact region of the second pad.

11. The display device of claim 9, wherein a number of the first contact holes in the first bonding region is greater than a number of the second contact holes in the contact region of the second pad.

12. The display device of claim 9, wherein a width of the second bonding region in the second pad is smaller than a width of the contact region in the second pad.

13. The display device of claim 9, wherein a width of the second bonding region in the second pad is greater than a width of the link region in the first pad.

14. The display device of claim 9, wherein the cross-sectional structure of the first bonding region is substantially identical to a cross-sectional structure of the contact region.

15. The display device of claim 9, wherein the second bonding electrode is on an insulating layer having the one or more second contact holes, and the second bonding electrode is electrically connected to the second signal line through the one or more second contact holes in the insulating layer.

16. The display device of claim 9, further comprising a short preventing layer covering the contact region of the second pad.

17. The display device of claim 9, wherein the second pad further comprises:
- a bridge region electrically connecting the second bonding region and the contact region.

18. The display device of claim 17, wherein a width of the bridge region is smaller than a width of the second bonding region and a width of the contact region.

19. The display device of claim 9, further comprising a thin film transistor having an active layer, a gate electrode, a source electrode, and a drain electrode,
- wherein at least one of the contact region of the second pad or the first bonding region of the first pad comprises:
  - a first signal pad in a same layer as the gate electrode;
  - a second signal pad in a same layer as the source electrode and the drain electrode, the second signal pad in the one or more second contact holes; and
  - a pad electrode in a same layer as the first anode electrode or the second anode electrode.

20. The display device of claim 19, wherein the second signal pad comprises a lower signal pad and an upper signal pad on the lower signal pad, the lower signal pad having a lower oxidation degree than the upper signal pad, and the upper signal pad having a lower resistance than the lower signal pad, and
- wherein the pad electrode comprises a first layer, a second layer on the first layer, and a third layer on the second layer, the first layer and the third layer having a lower oxidation degree than the second layer, and the second layer having a lower resistance than the first layer and the third layer.

* * * * *